(12) United States Patent
Zeng et al.

(10) Patent No.: US 7,705,705 B2
(45) Date of Patent: Apr. 27, 2010

(54) TRANSFORMER STRUCTURE

(75) Inventors: Jian Hong Zeng, Shanghai (CN); Teng Liu, Shanghai (CN); Jianping Ying, Shanghai (CN); Fan Li, Shanghai (CN); Aiming Xiong, Shanghai (CN); Ziying Zhou, Shanghai (CN); Haoyi Ye, Shanghai (CN); Xiaoni Xin, Shanghai (CN)

(73) Assignee: Delta Electronics Inc., Taoyuan Hsien (TW)

( * ) Notice: Subject to any disclaimer, the term of this patent is extended or adjusted under 35 U.S.C. 154(b) by 0 days.

(21) Appl. No.: 11/443,206

(22) Filed: May 31, 2006

(65) Prior Publication Data

US 2007/0152795 A1 Jul. 5, 2007

(30) Foreign Application Priority Data

Jan. 3, 2006 (TW) ............................. 95100252 A

(51) Int. Cl.
*H01F 27/24* (2006.01)
(52) U.S. Cl. ........................................ 336/212; 363/97

(58) Field of Classification Search ................ 336/200, 336/212

See application file for complete search history.

(56) References Cited

U.S. PATENT DOCUMENTS

| 6,124,778 | A | * | 9/2000 | Rowley et al. | ............... 336/200 |
| 6,529,389 | B2 | * | 3/2003 | Perlick et al. | ................. 363/20 |
| 6,788,184 | B2 | * | 9/2004 | Roche | ......................... 336/212 |
| 2005/0212640 | A1 | * | 9/2005 | Chiang et al. | ............... 336/200 |

* cited by examiner

*Primary Examiner*—Elvin G Enad
*Assistant Examiner*—Joselito Baisa
(74) *Attorney, Agent, or Firm*—Birch, Stewart, Kolasch & Birch, LLP

(57) ABSTRACT

The present invention discloses a transformer structure. The transformer structure comprises a first primary winding, and a first secondary circuits. The first secondary circuits comprises a filtering capacitor, a conductive Cu windings and a rectifier configured onto the printed circuit board (PCB) forming the first secondary circuits PCB winding. The first primary winding and the secondary circuits are interleaved with each other.

14 Claims, 12 Drawing Sheets

TRANSFORMER STRUCTURE

FIELD OF THE INVENTION

The present invention relates to a transformer structure with a power switching mode, and more particularly to a high power, high frequency transformer design.

BACKGROUND OF THE INVENTION

As power source has developed towards high power density nowadays, besides circuit structure itself, suitable component choices and circuit parameters optimization, non-conventional electrical design including electrical mechanism, thermal design and adequate printed circuit board (PCB) arrangement are becoming more significant in the actual design of power source to achieve higher efficiency. In power source design, the design of magnetic core element is particularly important due to the high frequency caused by high power density. Moreover, the design for power transformer is also a crucial point, especially in high power and high frequency applications. For example, the whole structure of a conventional DC/DC converter is shown in FIG. 1. The secondary side of a transformer 1 includes secondary windings, output rectifiers 3 and an output filter 4, while the primary side of the transformer 1 includes primary windings and primary switches 2. The primary switches 2 connect to an input terminal 5, and the output filter 4 is connected to a load 6. Increasing the frequency of the circuits' switches can effectively reduce the volume of the magnetic core element; however, this higher frequency generates numerous issues in the winding design of a transformer. Skin depth effect and proximity effect of conducting wires in high frequency operation will cause additional power loss on transformer windings itself and there between, especially apparent in high current output. Further, the output side structure of a conventional transformer is shown in FIG. 2, and the windings of the transformer 1 are connected to the primary switches 2, the output rectifiers 3 and filter 4. The rectifiers 3 and filters 4 of the output side are configured on a PCB, and Zp indicates parasitic impedance on the wires. Such arrangement results in secondary side wires of the transformer 1 extend a larger distance to the output rectifier and longer alternative passage. As a result, tremendous loss will occur on the equivalent parasitic resistance of the wires in high frequency and large current applications, such that the switch elements cause more switching power loss to affect reliability and efficiency of the circuits. Similarly, terminal power loss of the output windings of the conventional large power transformer 1 will be increased substantially due to terminal effect.

Accordingly, it has become an important factor to design a better transformer windings structure and output side structure for improving circuit reliability and efficiency. Thus, for the drawbacks of the prior art and numerous unfavorable features from conventional transformers discussed above, the present invention provides a novel transformer structure which can effectively reduce the length of AC wires and transformer's power loss, and thereby enhance the efficiency of the whole circuits.

SUMMARY OF THE INVENTION

In the light of the issue of outlet power over loss of output windings of the prior art transformer, the present invention provides a novel transformer structure that can effectively reduce the length of AC wires and transformer wear, and thereby enhance the efficiency of the whole circuits.

The main purpose of the invention is to provide a transformer structure which mainly employs the interleaved primary and secondary windings arrangement structure, and an inlet terminal and an outlet terminal of the secondary side windings take substantially perpendicular configuration, thus reduce enormously the thermal resistance and output terminal power loss, and prolong the lifetime of a transformer and increase transformer output efficiency and stability.

Another purpose of the invention is to provide a transformer structure that can utilize primary windings connected in parallel, secondary windings connected in parallel, or other different unit combinations to meet output power applications.

In accordance with the purposes discussed above, the present invention provides a transformer structure which comprises: a primary winding; multiple secondary circuit units, each of the secondary circuit unit comprising a printed circuit board (PCB) integrated; wherein the PCB integrated comprises at least one PCB with secondary circuits conducting coils; and at least a output rectifier circuit disposed on the PCB integrated, wherein the output rectifier circuit comprises output filtering device and a rectifier device.

The PCB integrated discussed above further comprises a driving chip configured onto the PCB, and the inlet end and outlet end of the secondary circuits conducting coils of the PCB integrated discussed above are substantially perpendicular.

Moreover, the high frequency transformer discussed above includes multiple primary windings. The output rectifier circuit discussed above further comprises a rectifier switch, the frequency of the rectifier switch is greater than 100 kHz.

The transformer structure discussed above further comprises at least two primary windings connected in parallel, and at least two secondary circuits units parallel.

The transformer structure discussed above further comprises at least two primary windings connected in series, at least two secondary circuits units parallel, wherein at least one secondary circuits unit outputs independently.

In addition, each primary winding and each secondary circuits unit take interleaved arrangement. Multiple primary windings include multi-layer windings, individual layers of a primary winding and the secondary circuits units are interleaved with each other.

The transformer structure discussed above further comprises an insulating medium for isolating the primary winding and the secondary circuit units. The transformer structure discussed above further comprises a masking layer disposed between the primary windings and first primary winding of secondary circuits unit and PCB windings of first secondary circuits, wherein each primary winding and secondary circuits unit take interleaved arrangement.

Further, the invention provides a high frequency transformer comprising a primary winding and multiple secondary windings; an iron core; each secondary windings of the transformer is connected to at least one rectifier switch, a ripple-reducing device having at least a capacitor connected to the rectifier switch; multiple rectifier filtering circuit substrates, each rectifier filtering circuit substrate having at least three conductor zones isolated from each other, at least two output ends of a secondary winding are connected to the first conductor zone and second conductor zone of the circuit substrate respectively, the ripple-reducing device connected to the third conductor zone and outputting the regulated DC voltage to a load.

BRIEF DESCRIPTION OF THE DRAWINGS

The present invention will become apparent from the following detailed description of certain preferred embodiments taken together with the accompanying drawings, and wherein.

DETAILED DESCRIPTION OF A PREFERRED EMBODIMENT

Several embodiments of the present invention are described in detail below. However, the invention can be widely implemented in other embodiments besides the detailed embodiments, and the invention is not limited to the following embodiments except as by the appended claims.

Figure 1:
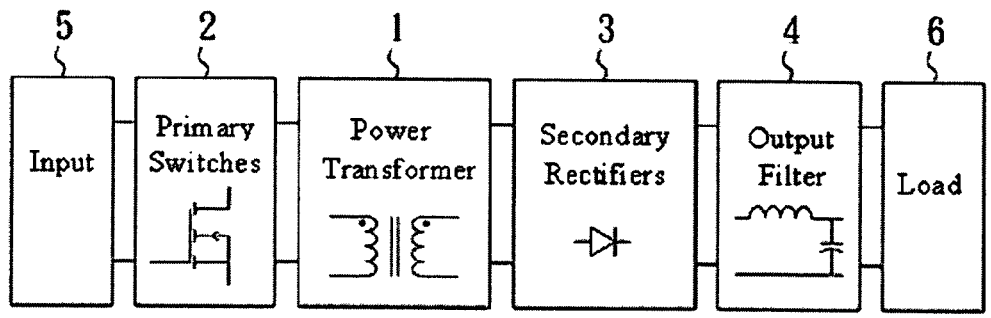
FIG. 1 shows a whole structure diagram of a conventional DC/DC transformer.
Figure 2:
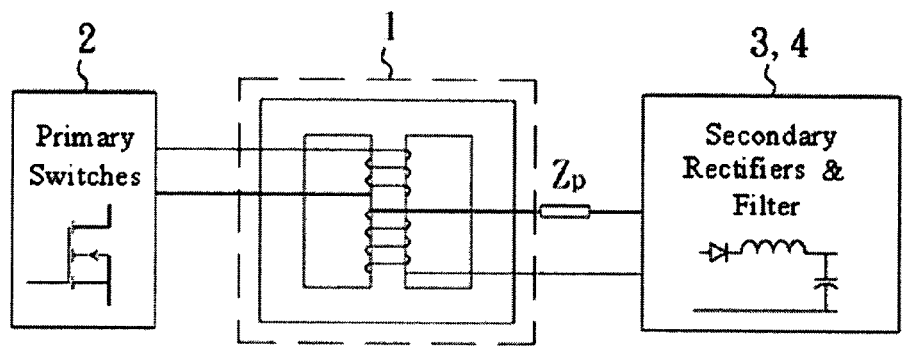
FIG. 2 shows the structure of primary and secondary sides of a conventional transformer.
Figure 3:
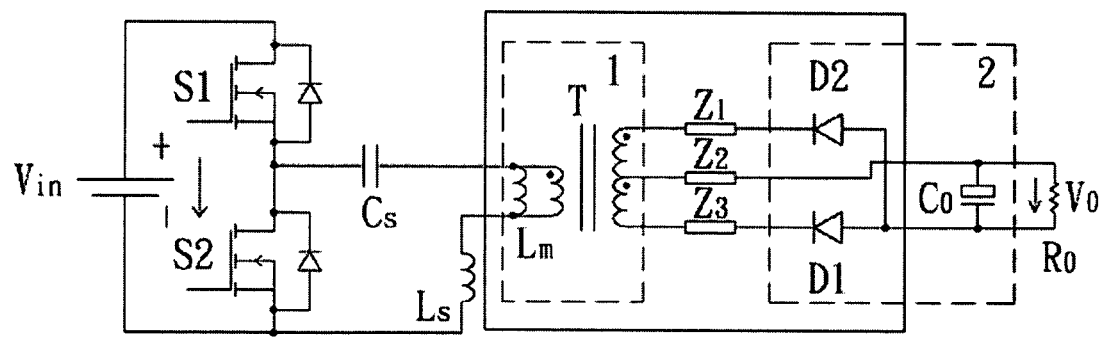
FIG. 3 shows a half-bridge LLC serial resonant circuit.

Referring now to the drawings wherein the showings are for the purposes of illustrating a preferred embodiment of the invention only and not limiting the invention. A structure diagram of a half-bridge LLC series resonant circuit is shown in FIG. 3, illustrating an integrated output rectifier unit (including an output filtering capacitor) of a secondary side of a transformer. The transformer structure of the invention can be applied to high power transformers and to other power range transformers as well. In general, an inductor (Ls), a capacitor (Cs), and a magnetizing inductor (Lm) of the transformer form a LLC resonant circuit. Two main switches S1 and S2 form a half-bridge structure to achieve a steady output voltage through varying switching frequency. The resonant circuit is connected between the midpoint of the half-bridge and the ground, thus the resonant capacitor Cs also functions as a blocking capacitor. On the output side, rectifier diodes D1 and D2 form a center-tapped rectifier circuit, and the rectifier diodes are directly connected to an output capacitor Co. In addition, Z1, Z2 and Z3 indicate parasitic impedance inhibiting in the wires. For example, the above LLC resonant circuit includes 1.2 kW LLC-SRC (Series Resonant Converter), wherein the output current of the circuit can reach 100 ampere (A) and the working frequency can reach the order of MHz, and the circuit structure requires its output filtering unit containing only the output filtering capacitor Co. Therefore, the design of conventional transformers not only causes terminal power loss and AC wire loss in high frequency and high current applications, but also will generate various faults, such as numerous thermal design issues and transformer windings power over loss. The transformer structure of the invention is preferred to solve the problems discussed above by integrating the output filtering capacitor and transformer windings, where whole structure of the transformer is as shown in FIG. 4.

Figure 4:
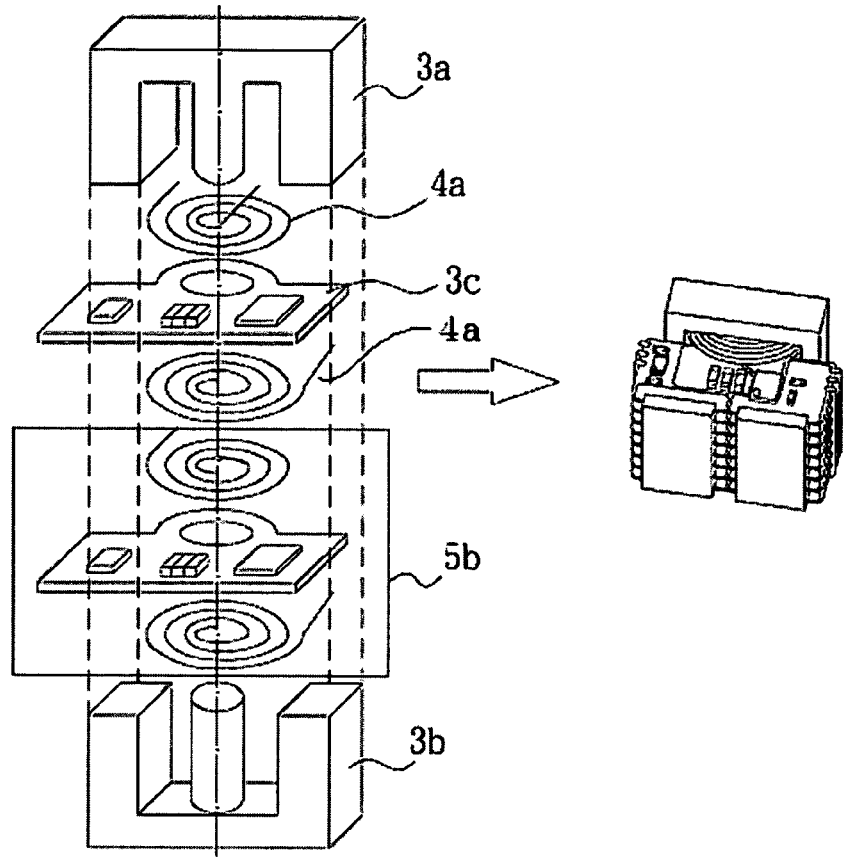
FIG. 4 shows a structure diagram of transformer assembly of the invention.

Referring to FIG. 4, in which a primary winding 4a of the transformer may be formed by employing a single core or multi-core wires to wind on the same plane such that the two winding layers are connected in series as the primary winding of a unit. A secondary circuits 3c is formed by employing a printed circuit board (PCB) windings to integrate output rectifier circuit including the filtering capacitor and the rectifier of the secondary side onto the PCB. In other words, the secondary circuits 3c is formed by integrating the PCB windings of the secondary side of the transformer, and the primary winding 4a is formed by connecting two-layer primary windings in series. Inserting the secondary circuits 3c into the primary winding 4a may create a unit 5b of the whole transformer. The whole transformer is formed by employing iron cores 3a and 3b to integrate multiple units 5b. In one embodiment, the above output rectifier circuit includes a rectifier switch which working frequency is larger than 100 Khz. The whole transformer design can be created by connecting several such units 5b in parallel, and then the optimization of whole transformer can be simplified to optimize each parallel unit. The larger the power, the more units 5b connected in parallel are needed.

Figure 5:
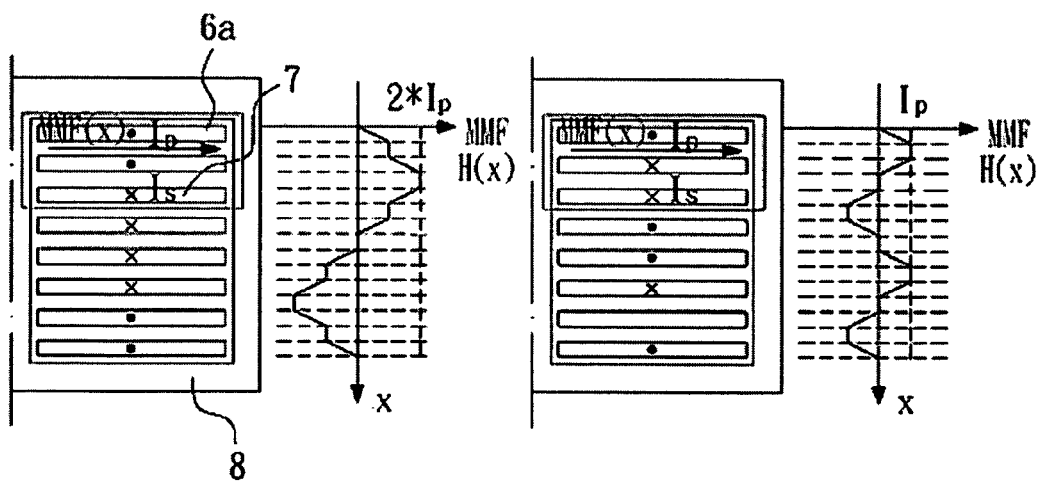
FIG. 5 shows magnetic motive forces distributions of a conventional sandwiched transformer and the internal windings of interleaved transformer of the invention.

Next, referring to FIG. 5, magnetic motive forces (MMF) in a vertical direction of the inner windings of a conventional sandwich transformer and of an interleaved transformer of the invention are shown. The numeral 6a is a primary winding, numeral 7 is a secondary winding and numeral 8 is a magnetic core. The magnetic field distribution inside the transformer can be obtained by Ampere's Law, as the curves shown in the FIG. 5, wherein MMF affects directly the power loss of transformer windings. In other words, the larger the MMF, the greater the power loss of windings of a transformer is. The left diagram of FIG. 5 shows a conventional sandwich transformer and its MMF distribution, and the right diagram of FIG. 5 shows the interleaved structure transformer of the invention and its MMF distribution. The comparison of these two diagrams gives that the interleaved structure produces smaller windings power loss of the transformer, i.e. copper loss reducing remarkably.

Figure 6:
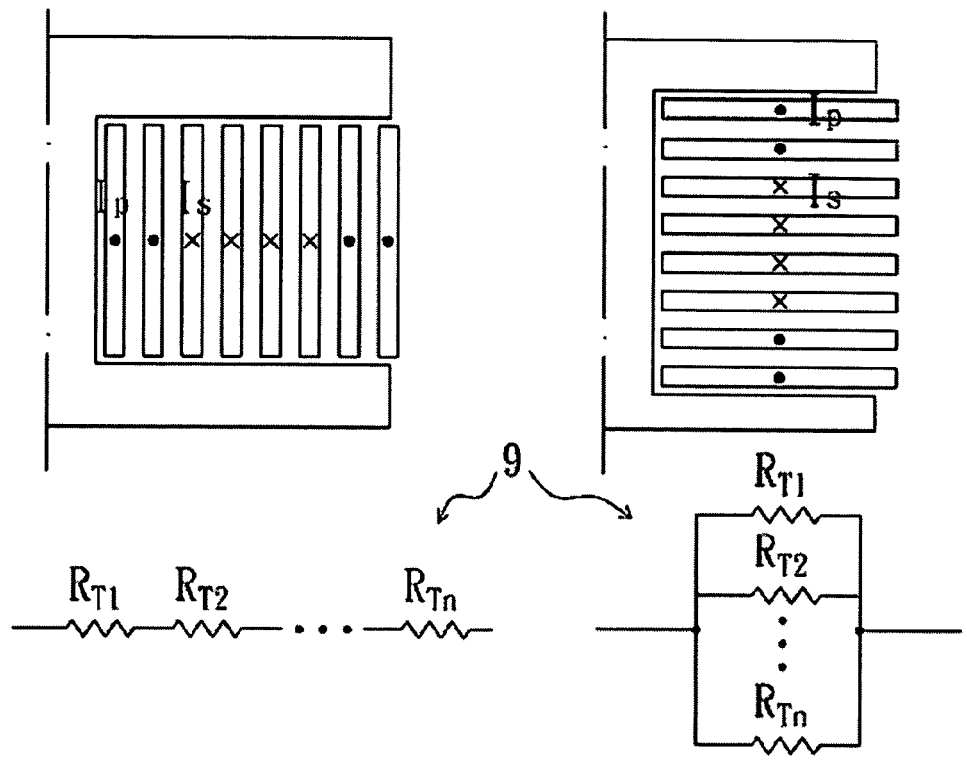
FIG. 6 shows equivalent thermal resistance model of a conventional transformer and of the transformer of the invention.

Referring to FIG. 6, according to a thermal design perspective, heat dissipation of a transformer is derived mainly from its windings and iron cores. Equivalent thermal resistance 9 of the windings of a conventional transformer is similar to that of a serial connection structure, as shown in the left diagram of FIG. 6. Consequently, cooling condition of inner windings of the transformer is very poor, and there exists a more serious thermal issue. The transformer of the invention provides a new windings arrangement, and its equivalent thermal resistance 9 is similar to that of a parallel connection structure, as shown in the right diagram of FIG. 6, wherein all windings can dissipate heat directly to the outside of the transformer, and thus the thermal resistance is reduced notably and the cooling performance is improved.

Figure 7:
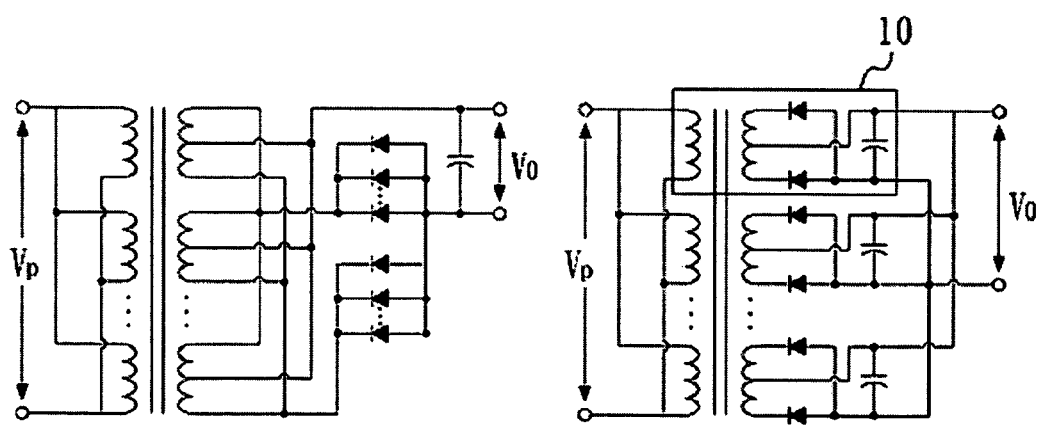
FIG. 7 shows equivalent circuit diagrams of a conventional transformer and of the transformer using integrated technology of the invention.

Referring to FIG. 7, it shows the circuit differences by using different secondary integrated circuits. A conventional transformer, which equivalent circuit is shown in the left diagram of FIG. 7, is employed a traditional winding method and filtering finally. The transformer of the invention can be applied to a high power transformer that comprises several parallel cells 10, and each of which can distribute power effectively. The transformer structure of the invention is formed by employing the structure of parallel primary windings and parallel secondary circuits, and the differences from conventional transformers are the integration technology of the secondary circuits and the interleaved winding structure of the primary windings and secondary circuits. With the integration method, terminal structure of the transformer secondary side can be simplified to reduce terminal power loss and to decrease notably the length of output AC paths, and to reduce the impact of parasitic parameters on the circuits as well. Moreover, an original transformer AC terminal can be changed to a DC terminal.

Figure 8:
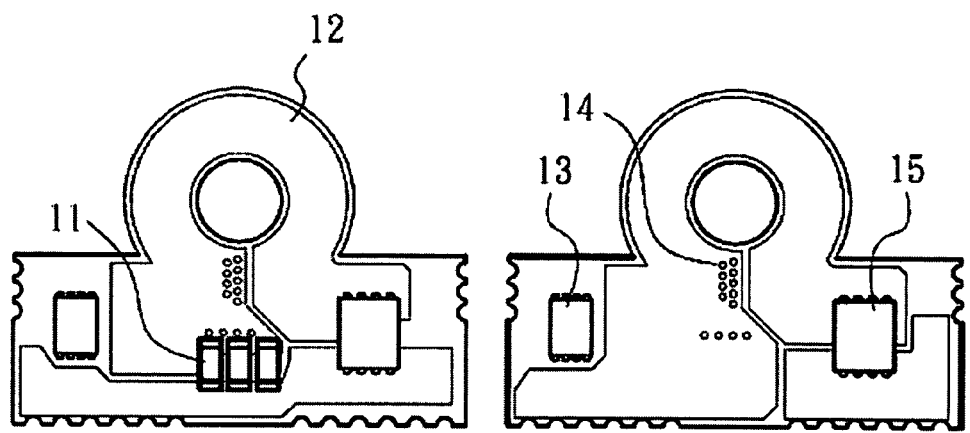
FIG. 8 shows a specific structure schematic diagram of printed circuit board (PCB) winding of a transformer secondary side with one coil.

Referring to FIG. 8, the integration technology of the PCB windings of the secondary side is shown. The integration technology of the secondary side (i.e. the transformer secondary circuits) is a core of the transformer design, and its detailed structure is shown in FIG. 8. The PCB is formed by top and bottom layers connected to the output terminal and input terminal respectively, shown in the left and right diagrams of FIG. 8 respectively. For example, the transformer secondary side comprises an output filtering capacitor 11 integrated onto the PCB, PCB conducting coils 12, a driving chip 13 and an output rectifier 15. Further, the front and back sides of the PCB have through holes 14 allowable for the top layer connecting to the bottom layer windings of the secondary circuits. For the center-tapped transformer structure, the top and bottom layers structure of the PCB is entirely symmetric. Synchronous rectifier technology are typically used in low voltage and high current applications, the PCB windings of the secondary side of the transformer are integrating the output filtering capacitor and driving chips, and therefore outputting through synchronous rectifier metal oxide semiconductor field effect transistor (MOSFET). The output AC paths shown in the diagram appear to be very short, and they can reduce the power loss effectively in high frequency and high current applications.

Figure 9:
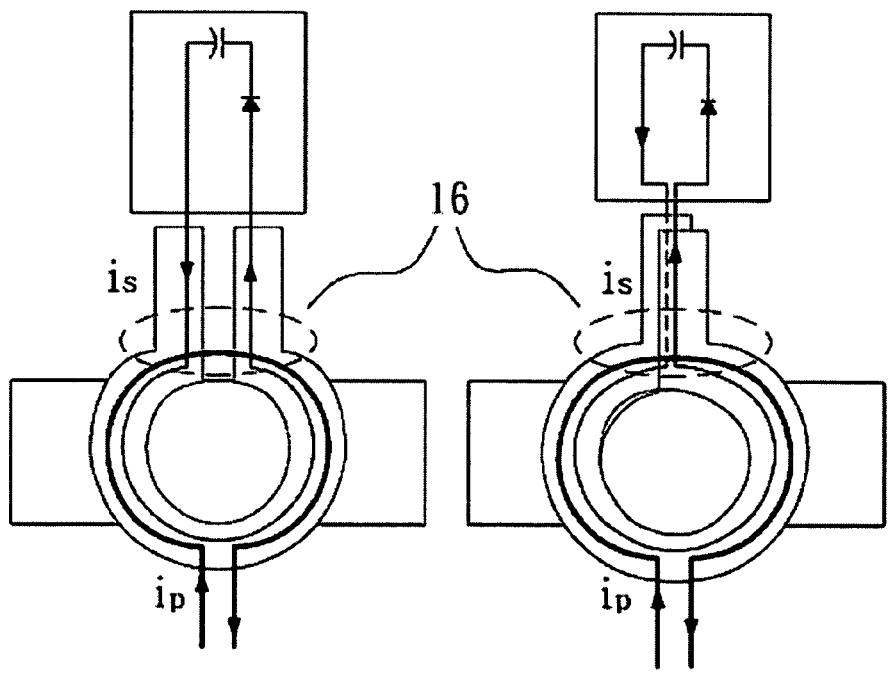
FIG. 9 shows the effects caused by different terminals of a transformer.

Referring to FIG. 9, there are shown the effects caused by different terminal structures of the transformer. The utilization of PCB windings is advantageous in reducing terminal power loss. The left diagram of FIG. 9 shows the terminal structure of a secondary side of conventional conductive Cu windings which causes the power loss on terminals 16. Due to parallel configuration of the inlet terminal and outlet terminal of the secondary side windings, the magnetic field generated by primary windings AC ip makes output side current uneven distribution and thereby causes tremendous power loss. By contrast, the invention uses overlapping output terminal structure shown in the right diagram of FIG. 9. Due to the inlet terminal and outlet terminal of the secondary side windings substantially perpendicular, the magnetic fields generated by AC of the primary windings and secondary circuits can be counteracted and thereby the power loss can be reduced enormously. For normal conductive Cu windings, connecting wires terminal is relatively complicated, and it is even more complicated in multiple units connected in parallel, and thus the utilization of PCB windings method can solve this issue easier. Further, the inlet and outlet terminal of the primary side of primary windings can also take substantially perpendicular configuration.

Moreover, an additional heat-dissipation plate providing for the output rectifier is not required because of good heat-dissipation condition of conductive Cu on the PCB windings, hence the volume space of the transformer can be condensed effectively and the power density may be enhanced enormously. Based on actual design results, about 40% volume of the transformer structure of the invention can be reduced in the same order of power, and it can be applied to a high power density application.

Figure 10:
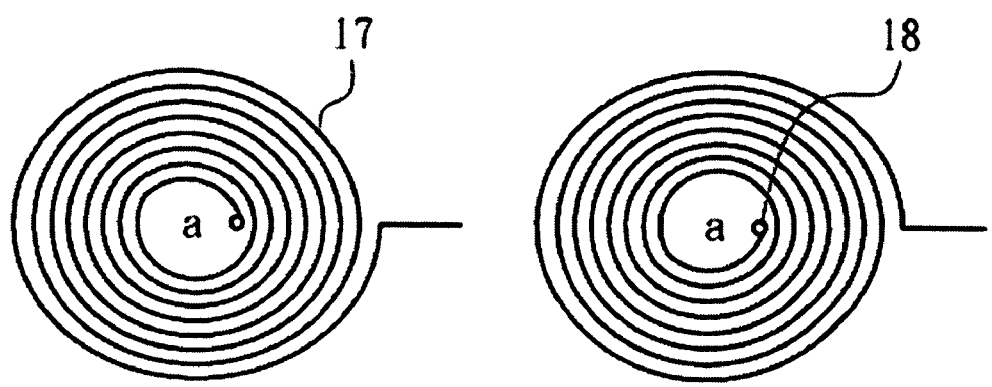
FIG. 10 shows a structure diagram of primary windings.
Figure 11:
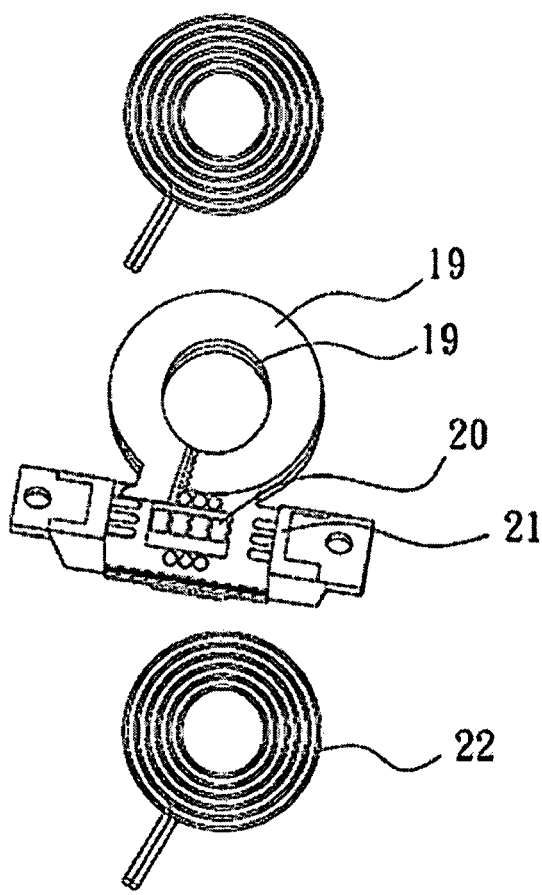
FIG. 11 shows a schematic diagram of a unit formed by primary windings and secondary circuits of the secondary side in multiple coils of a transformer.

Referring to FIG. 10, there is shown a structure diagram of a primary winding. A primary winding is formed by employing winding a single core or multi-core wires 17, such as conductive Cu. Each unit includes two-layer windings 17 connected to each other at connecting end 18, and configured on the two sides of the secondary circuits PCB windings respectively, as shown in FIG. 4. In addition, the connecting end 18 can also be disposed on the outside of the primary windings to be drawn out from there between, as shown in FIG. 11. As described above, this is the novel transformer structure presented by the invention based on the secondary circuits employing the PCB windings integrating the output filtering capacitor and the output rectifier of the secondary side, and several units interleaved connecting in parallel. Further, it must be emphasized that the choice of magnetic core of the invention is not limited to that shown in the diagrams; other various types of magnetic core with different shapes can also be used.

Figure 12:
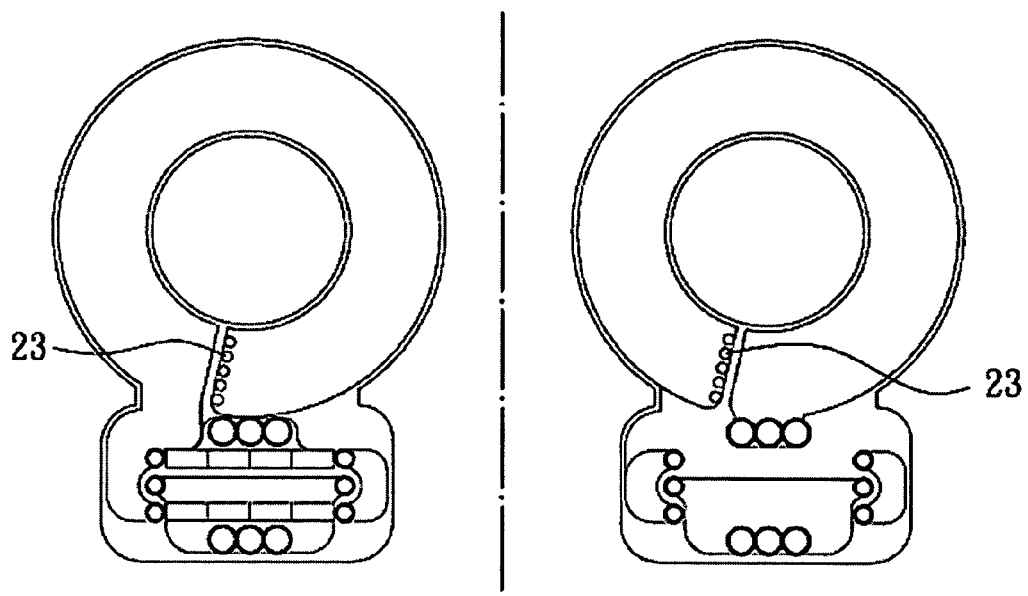
FIG. 12 shows structure diagrams of front and back layers of a PCB winding of the secondary side.
Figure 13:
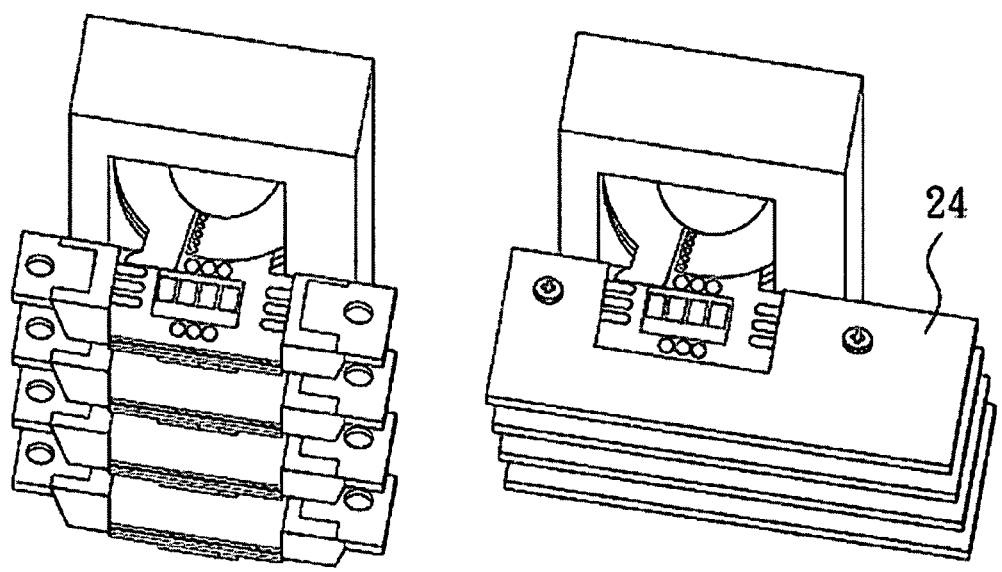
FIG. 13 shows structure diagrams of output rectifiers of the secondary side in many coils before and after adding heat-dissipation plates.

Referring to FIG. 11, there is shown a schematic diagram of a unit formed by a primary winding and secondary circuits in multiple coils of the secondary side of the transformer. For lower output voltage, the primary winding is taken by one coil as described above. Two-coil windings can be formed by connecting two PCB plates in series, for example, two top-bottom layer conductive Cu windings 19 forming the two-coil windings. Similarly, an output filtering capacitor 20 is integrated into the PCB, and an output rectifier 21 is configured on the two sides of the PCB. In other words, in this embodiment, two PCB plates are connected in series as the PCB integrated, wherein there are no complete filter and rectifier devices on one PCB or both PCBs. As shown in FIG. 11, a filter 20 may be disposed on each board in two PCBs overlapping, and the rectifier device 21 can be shared by two boards. Alternatively, the filtering device can be shared, and therefore the PCB integrated with multiple PCBs possesses the complete filtering and rectifier functions. Further, a primary winding 22, similar to FIG. 4, and the two top-bottom layer conductive Cu windings 19 form a unit. The PCB windings structure 19 may be integrated an output filtering capacitor, as shown in FIG. 12, and nearby configured an output rectifier to reduce AC paths. The top and bottom two-layer conductive Cu are connected in series through the holes 23. Several units in FIG. 11 can be connected in parallel to form the whole transformer structure, as shown in the left diagram of FIG. 13. Moreover, heat-dissipation plates 24 may be added into the structure for the output rectifier shown in the right diagram of FIG. 13, and the heat-dissipation plate 24 can be employed simultaneously as output wires.

Figure 14:
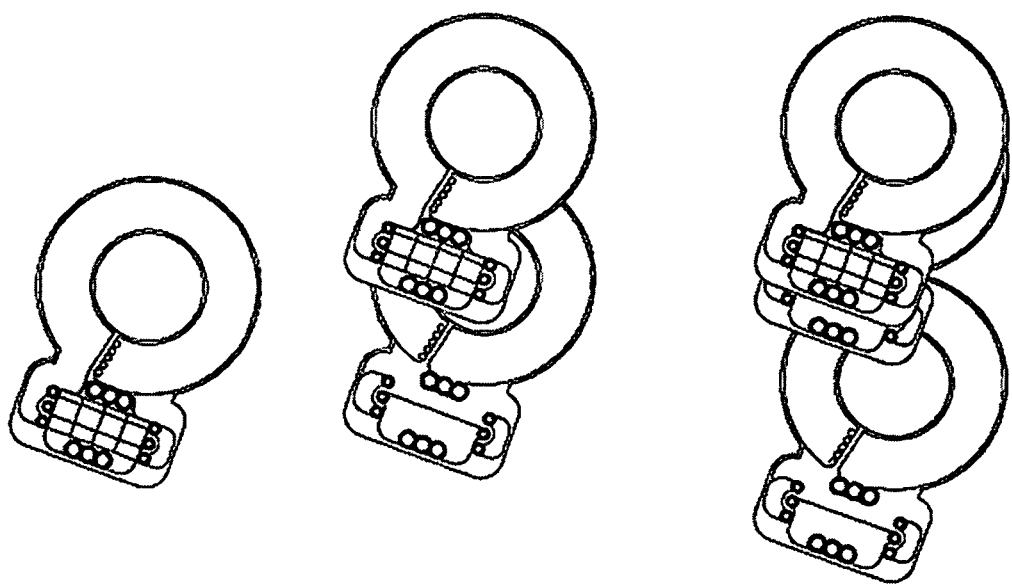
FIG. 14 shows schematic diagrams of PCB windings with different coil numbers.
Figure 18:
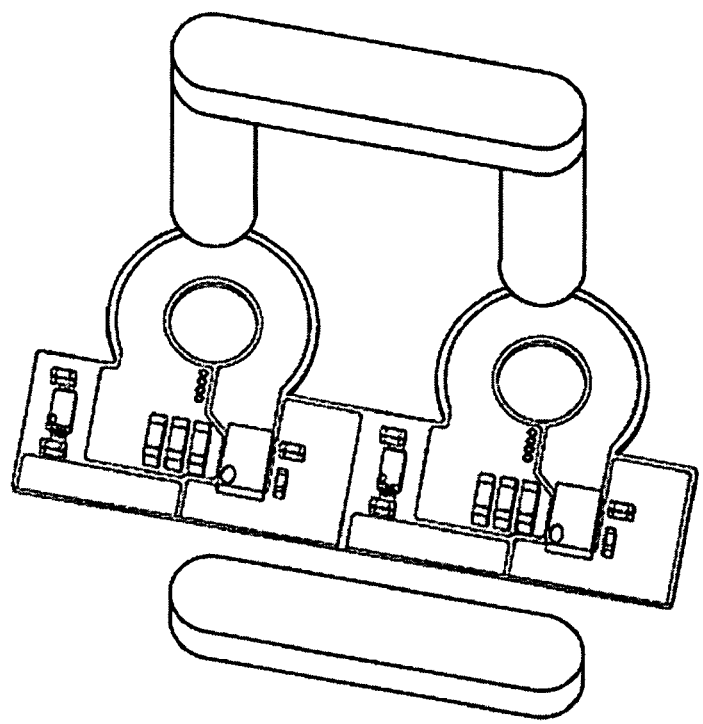
FIG. 18 shows a structure of two integrated units using a PCB.
Figure 19:
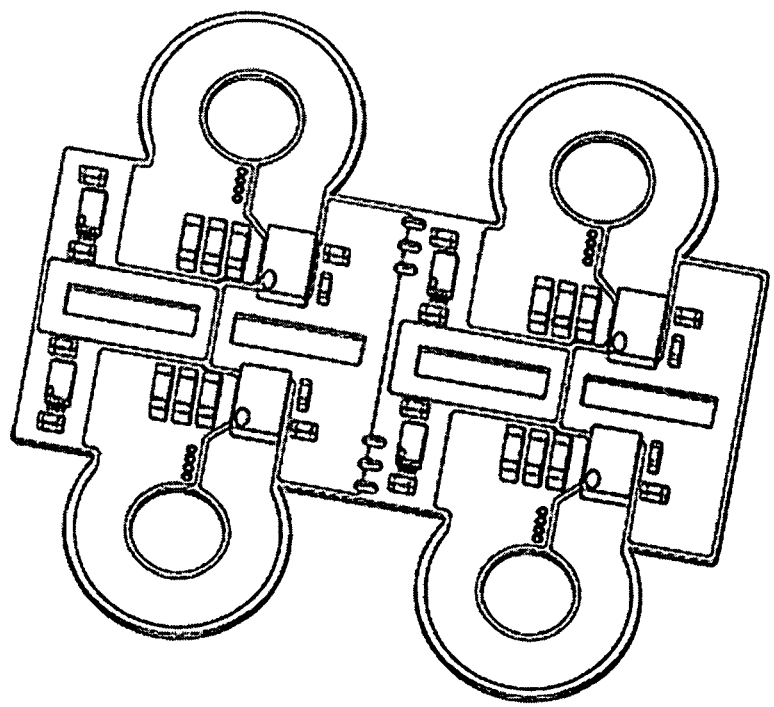
FIG. 19 shows a schematic structure diagram of more units integrated into a PCB.

Similarly, the transformer structure of the invention can also be taken by more than two coils, such as 2 or N coils, which can be achieved by connecting the above corresponding amounts of the PCB windings in parallel, as illustrated in FIG. 14. Accordingly, the transformer structure of the invention is applicable to multiple-coil PCB windings and the situation in requiring heat-dissipation plates. Moreover, the structure of two units integrated into a PCB is shown in FIG. 18. Similarly, the invention is also applicable to the structure which more secondary circuits units are integrated together into a PCB, as shown in FIG. 19.

Figure 15:
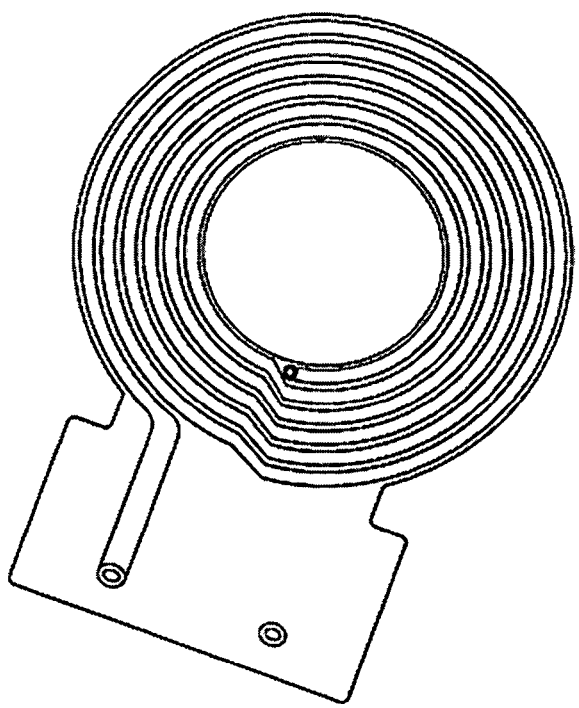
FIG. 15 shows a structure diagram of a primary winding using PCB winding.
Figure 16:
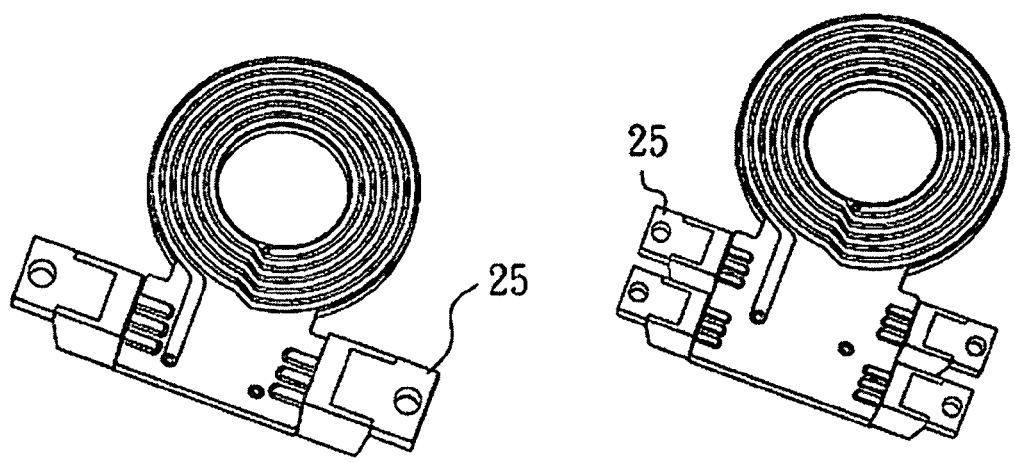
FIG. 16 shows a winding structure of a primary winding using PCB integrated technology.
Figure 17:
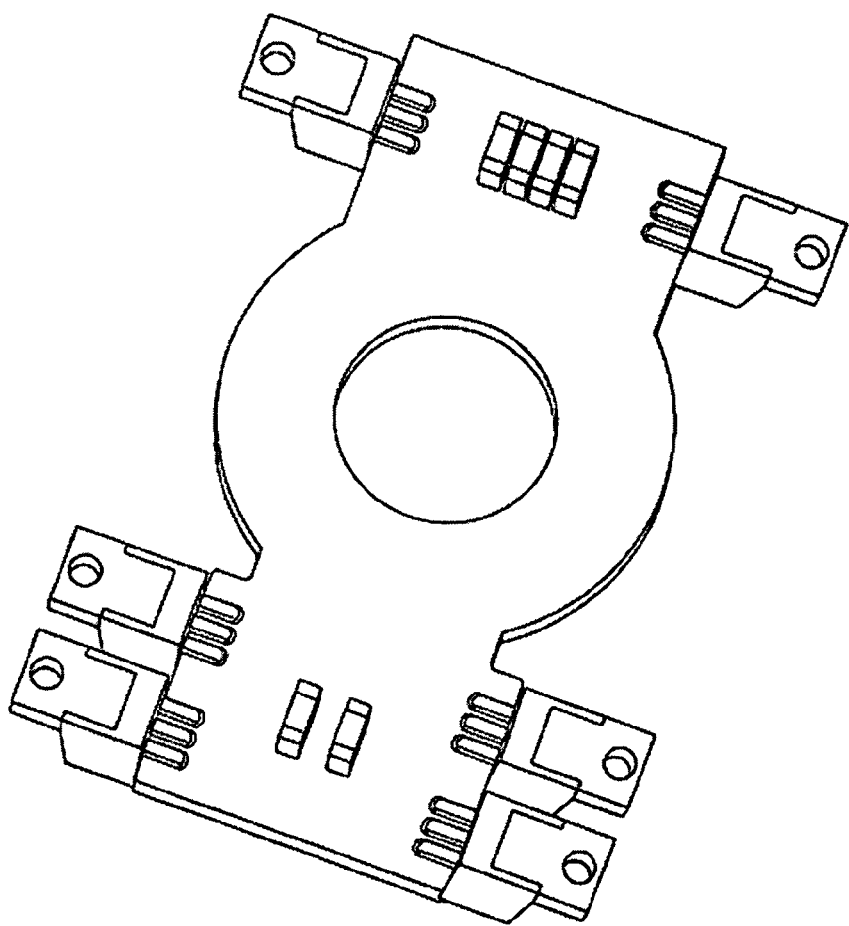
FIG. 17 shows a structure of primary and secondary windings all integrated into a PCB.

Similar to the secondary circuits, the primary windings can also be made by using the PCB windings or by using the PCB integrating primary windings switch circuits 25, as shown in FIG. 15 and in FIG. 16. Further, primary and secondary windings can be integrated into a PCB as well, as shown in FIG. 17.

Figure 20:
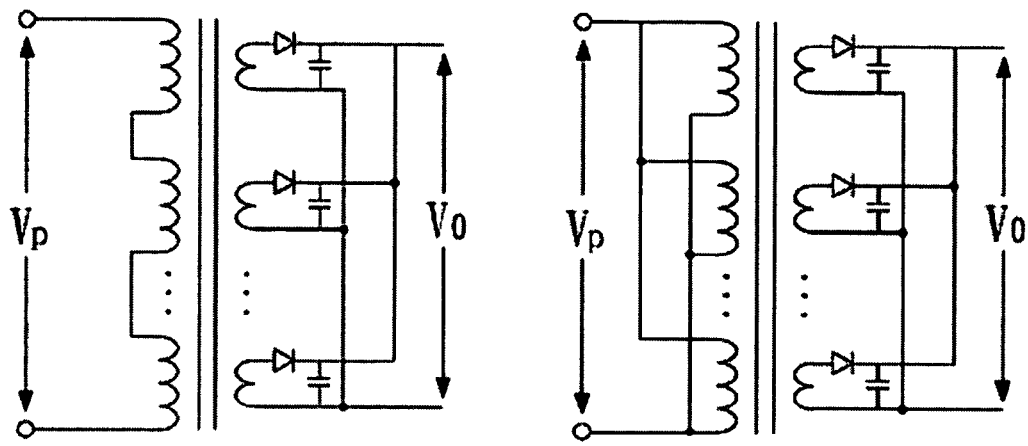
FIG. 20 shows schematic diagrams of possible primary and secondary winding forms of the transformer structure.
Figure 21:
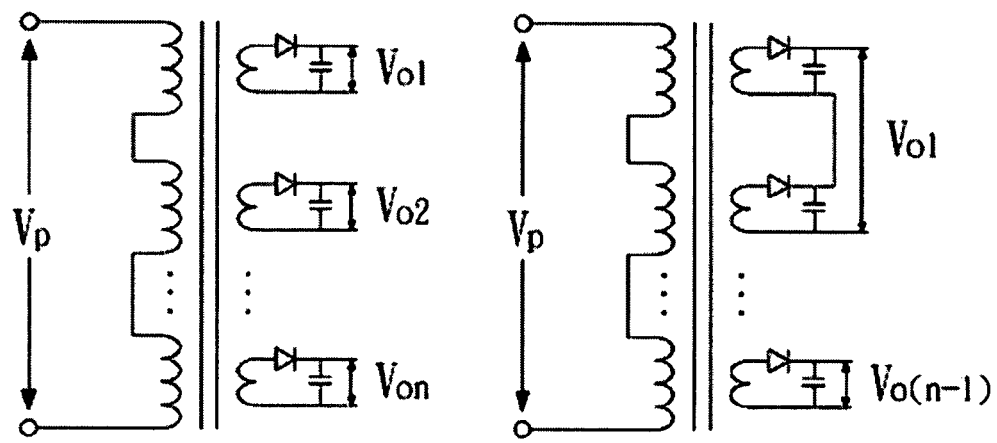
FIG. 21 shows schematic diagrams of possible combination forms of the secondary side of the transformer structure.

The transformer structure of the invention can be applied to the case wherein the voltage of the primary windings is greater than that of the secondary circuits, or wherein the voltage of the secondary circuits is greater than that of the primary windings. In other words, it can be attained by interchanging the primary and secondary windings, and they all belong to the transformer types of the present invention. Further, for the windings combinations, the transformer structure can be applied to the primary windings connected in parallel and the secondary circuits connected in parallel, as shown in the right diagram of FIG. 20. In addition, it can also be applied to the primary windings connected in series and the secondary circuits connected in parallel, as shown in the left diagram of FIG. 20. For the secondary side, different units can be combined to meet various output requirements, as shown in the right diagram of FIG. 21, or each path as an independent load output, as shown in the left diagram of FIG. 21.

Figure 22:
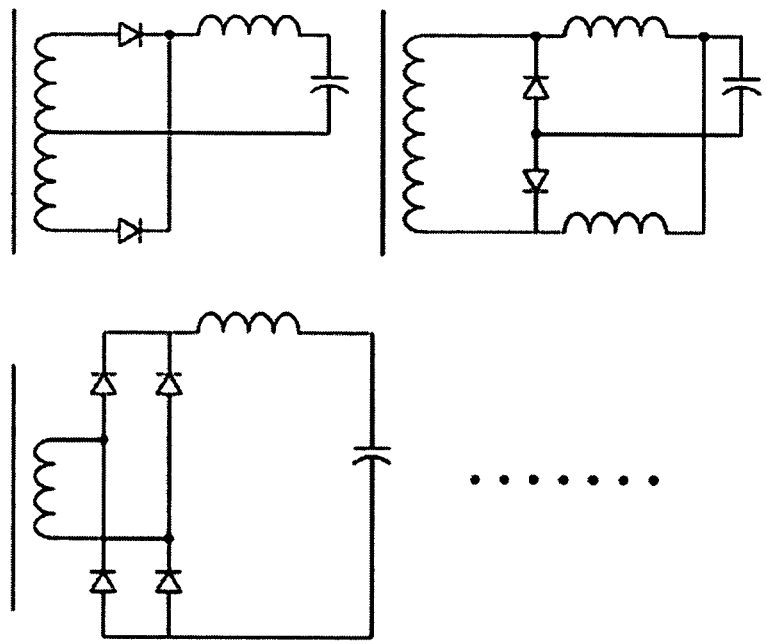
FIG. 22 shows the different topology of the usable secondary side of the integrated PCB.

The application transformer discussed above comprises the secondary circuits center-tapped half wave rectifier circuit transformer, wherein the PCB integration method is applicable to any other output structure, such as whole-bridge rectifier output circuit and current multiplication rectifier circuit, as shown in FIG. 22. Similarly, output rectifier and filter can be integrated onto the PCB windings. Moreover, output filtering inductance shown in the Figure can either be additional inductance or magnetic integrated inductance.

Figure 23:
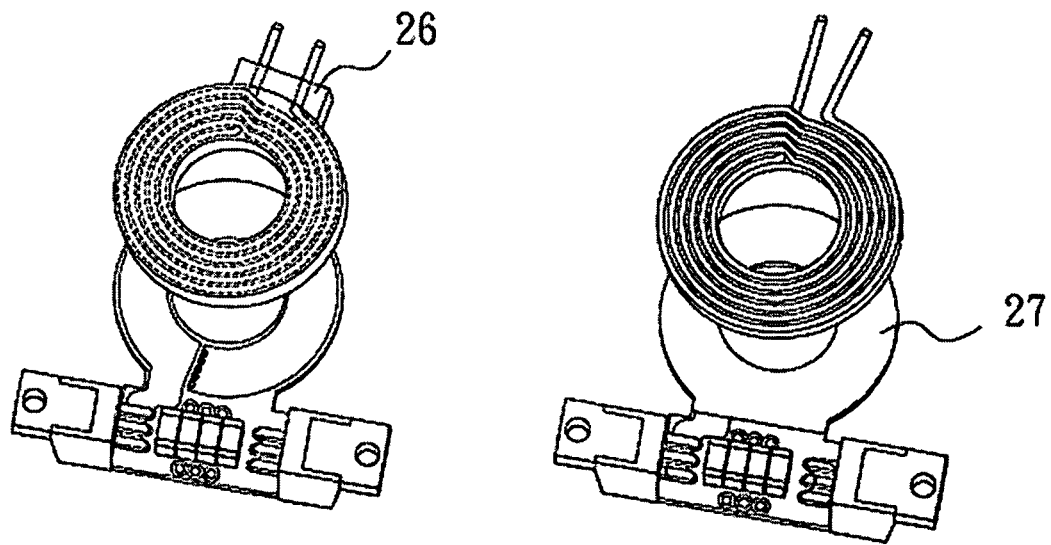
FIG. 23 shows schematic structure diagrams of two safety solutions for primary and secondary windings.
Figure 24:
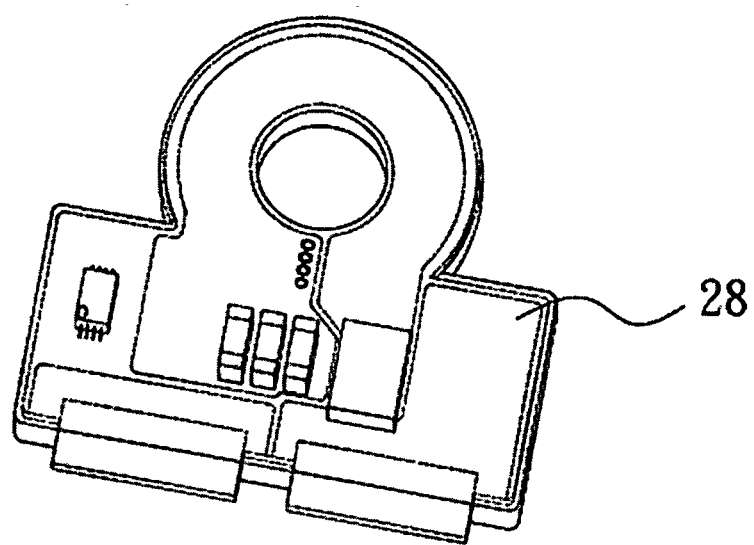
FIG. 24 shows another safety solution.

Since the primary windings and secondary circuits of the transformer of the invention are attached closely, the safety issues appear to be more important relative to conventional transformers. An additional insulating medium 26 can be utilized to wrap up the primary windings to meet the insulation requirements of safety for the primary windings and secondary circuits of the transformer, as shown in the left diagram of FIG. 23. Alternatively, insulating material 27 coating on the PCB windings or three-layer insulating wires can be utilized to meet the safety requirements, as shown in the right diagram of FIG. 23. Similarly, the PCB windings of the secondary circuits can be wrapped up by insulating medium 28 to solve the safety issues, as shown in FIG. 24.

Figure 25:
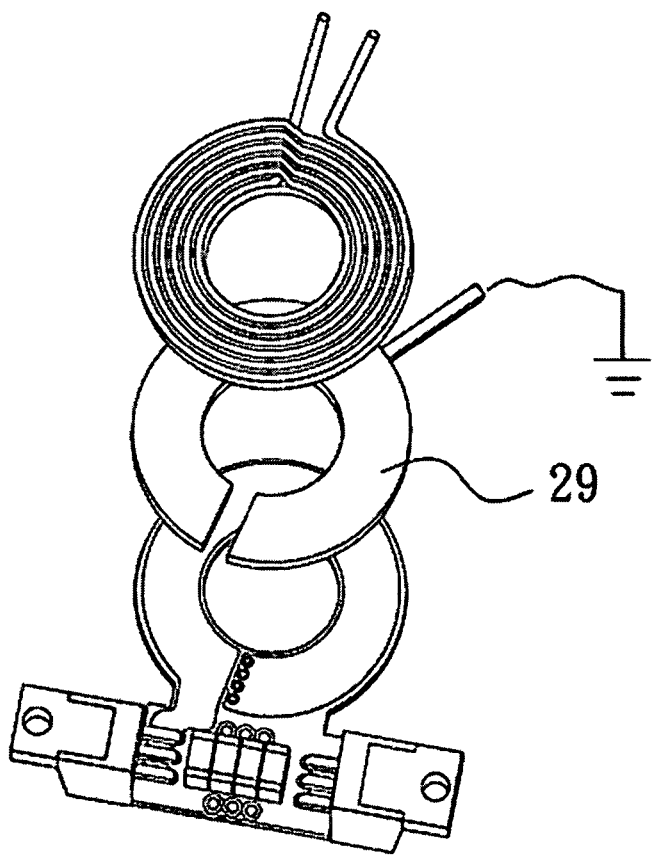
FIG. 25 shows a plan for electromagnetic interference elimination by adding a masking layer.

Because between transformer windings creates a larger parasitic capacitance in power transformer design, a masking layer 29, such as copper foil, can be added between transformer windings to enhance isolation effect for high frequency interference, and the masking layer 29 grounds. The length of ground wire should be as short as possible, otherwise the attenuation effect of the interference would be poor due to impedance voltage division of the ground wire. Referring to FIG. 25, a typical single masking layer 29 is added between the primary and secondary side of the transformer to reduce electromagnetic interference.

In some applications, one layer in multi-layer PCB structure can be used as a masking layer, so that additional copper foil is not required.

Accordingly, relative to terminal power loss and heat dissipation issues of the transformer of the prior art are difficult to meet strict requirements, the technology solution presented by the invention can meet low terminal power loss and heat dissipation requirements, and achieve high circuit reliability and efficiency simultaneously.

From the foregoing, it shall be appreciated that specific embodiments of the invention have been described herein for purposes of illustration, but that various modifications may be made without deviating from the spirit and scope of the invention. Accordingly, the invention is not limited except as by the appended claims.

We claim:

1. A high frequency transformer structure, comprising:
multiple primary windings;
multiple secondary circuits units, each said secondary circuits unit including a printed circuit board (PCB) integrated, wherein said PCB integrated includes at least one PCB with secondary circuits conducting coils; and
an output rectifier circuit disposed on at least one PCB of said PCB integrated,
wherein said output rectifier circuit includes an output filtering device and a rectifier device,
wherein the working frequency of said rectifier device is larger than 100 Khz;
wherein each said primary winding and said secondary circuits unit are interleaved with each other.

2. The transformer structure of claim 1, wherein said filtering device and said rectifier device are disposed between two said PCB integrated.

3. The transformer structure of claim 1, wherein said PCB integrated includes a driving chip formed thereon.

4. The transformer structure of claim 1, wherein said primary winding and said secondary circuits units are replaceable.

5. The transformer structure of claim 1, wherein the inlet end and the outlet end of said secondary circuits conducting coils of said PCB integrated are substantially perpendicular.

6. The transformer structure of claim 1, further including at least two said primary windings connected in parallel, and at least two said secondary circuits units parallel.

7. The transformer structure of claim 1, further including at least two said primary windings connected in series, and at least two said secondary circuits units parallel.

8. The transformer structure of claim 1, wherein at least one said secondary circuits unit outputs independently.

9. The transformer structure of claim 1, wherein said multiple primary windings comprise multi-layer windings, each said windings of said primary winding and said secondary circuits units are interleaved with each other.

10. The transformer structure of claim 1, further including an insulating medium for isolating said primary winding and said secondary circuits units.

11. The transformer structure of claim 1, further including a masking layer disposed between said primary windings and said secondary circuits units.

12. A high frequency transformer, comprising:
- a primary winding, and multiple secondary windings;
- an iron core;
- each said transformer secondary windings connected to at least one rectifier component;
- a ripple-reducing device having at least one capacitor connected to said rectifier component;
- multiple rectifier filtering circuit substrates, at least three conductor zones isolating from each other formed on each said rectifier filtering circuit substrate, two output ends of at least one said secondary windings connected to the first conductor zone and the second conductor zone of said circuit substrate, said ripple-reducing device connected to the third conductor zone and outputting the regulated DC voltage to a load.

13. The transformer structure of claim 1, wherein two said primary windings that are connected and one said secondary circuits unit constitute a transformer unit.

14. The transformer structure of claim 1, wherein two said primary windings and one said secondary circuits unit between said two primary windings constitute a transformer unit, and said transformer includes multiple said transformer units.

* * * * *